United States Patent [19]
Benedette et al.

[11] Patent Number: 5,743,457
[45] Date of Patent: Apr. 28, 1998

[54] CONTROLLED ZONE SOLDER DISPENSING

[75] Inventors: Walter Benedette; Medhat Said, both of Dearborn; Andrew Z. Glovatsky, Ypsilanti, all of Mich.

[73] Assignee: Ford Motor Company, Dearborn, Mich.

[21] Appl. No.: 627,793

[22] Filed: Apr. 1, 1996

[51] Int. Cl.$^6$ .................................................. B23K 3/06
[52] U.S. Cl. ................................... 228/33; 228/180.21
[58] Field of Search ........................ 228/180.21, 33, 228/254

[56] References Cited

U.S. PATENT DOCUMENTS

| | | |
|---|---|---|
| 989,818 | 4/1911 | Smith . |
| 3,025,817 | 3/1962 | Switch . |
| 5,133,120 | 7/1992 | Kawakami et al. . |
| 5,191,709 | 3/1993 | Kawakami et al. . |
| 5,364,011 | 11/1994 | Baker et al. . |

Primary Examiner—Kenneth J. Ramsey
Attorney, Agent, or Firm—Joseph W. Malleck

[57] ABSTRACT

A solder dispensing apparatus for depositing fluid solder into and around a pin-in-through-hole joining zone of an electronic circuit board which comprises:

a valve assembly defining a valve chamber with an inlet and an outlet, and having the valve member actuated by the pin of said pin-in-through-hole joining zone when the valve is positioned at the zone against the board, the valve member moving from a first position closing off fluid flow from the outlet to a second position permitting fluid flow through the outlet; means for measuring a predetermined body of fluid solder that is released from the chamber when said valve member is in the second position with the assembly positioned at the zone against the board; and means to contain the released fluid solder in a predetermined shape and in and around the pin-in-through-hole joining zone while the solder solidifies.

18 Claims, 3 Drawing Sheets

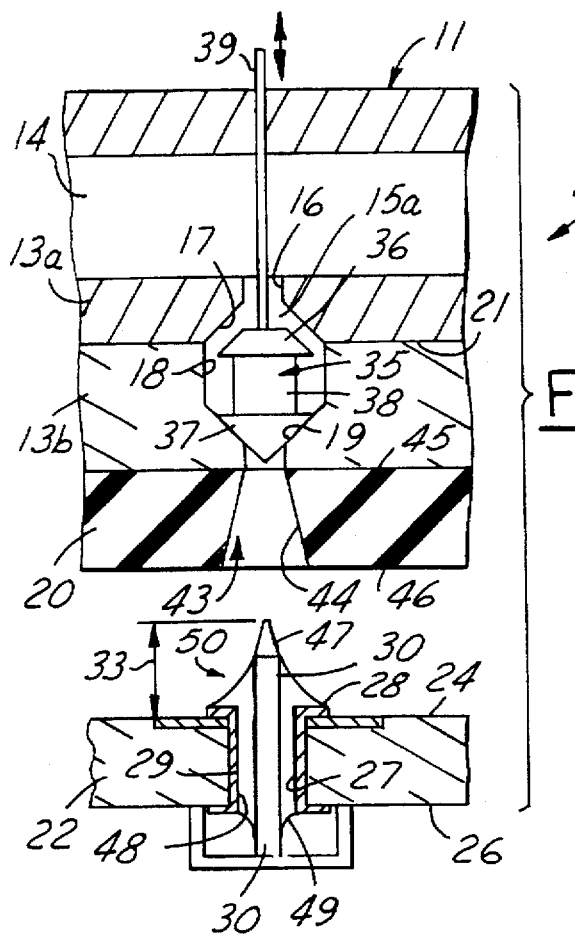
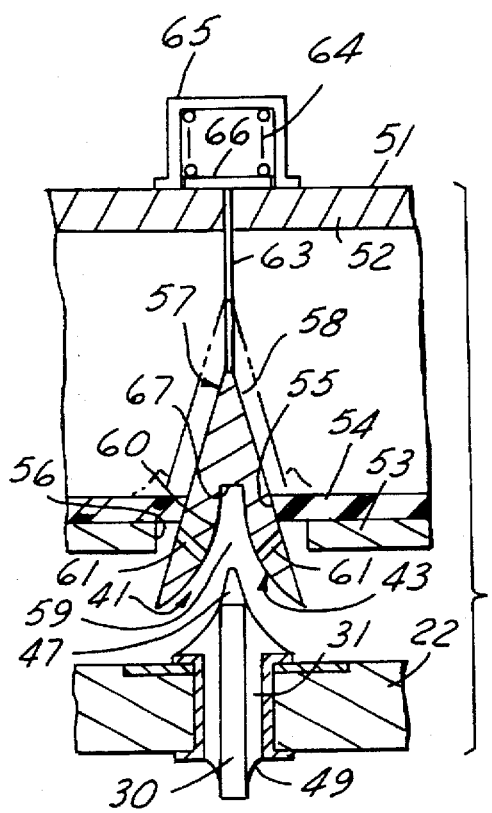
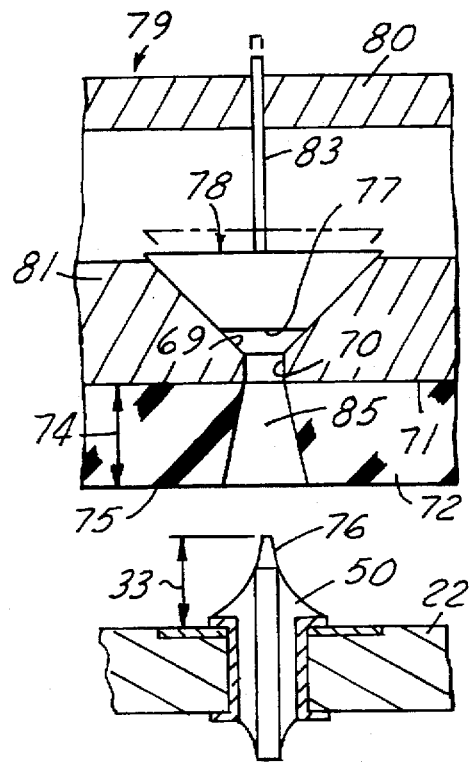
FIG. 3
FIG. 4
FIG. 5

CONTROLLED ZONE SOLDER DISPENSING

BACKGROUND OF THE INVENTION

1. Technical Field

This invention relates to the art of dispensing molten solder to effect an electrical contact through a mechanical joint, and more particularly to dispensing solder to effect pin-in-hole joints.

2. Discussion of the Prior Art

In electronic circuit boards, external components or wires are often connected to the board circuit by placing metallic connectors or pins into and through holes in the board with solder locking the pins spatially within the hole; this creates a mechanically strong joint and an effective electrical contact therebetween. Pin-in-through-hole joints are different from most electrical or electronic joints because the solder must flow into an annular gap surrounding the pin under the influence of gravity and capillary action, while unsupported. Control of solder placement depends in part on solder viscosity and surface tension with the pin and board; sometimes such factors are not sufficient to ensure accurately and well formed fillets that achieve a desired strong joint with negligible contact resistance in a matter of microseconds from deposition. This is particularly true for multiple pin-in-through-hole joints (numbering in the tens or hundreds) that must be tightly spaced and yet achieve separate electrical pathways. Unwanted electrical bridges may form between adjacent pin-in-hole joints when using existing soldering techniques.

Screen printing or stenciling of solder paste to effect pin-in-through-hole joints is unsatisfactory because a common regular flat surface is needed for both parts to be joined; furthermore, the joint must be surrounded by a wide margin to support the screen or stencil, and the substrate must be heated after dispensing to allow for wetting and flow of the solder to form the joint contour.

Prior art techniques to effect pin-in-through-hole joints usually include firstly dropping fluid solder from a solder reservoir through a single dispensing gun for a single through hole. The flow of the solder is shut off within the gun by a valve which is unable to measure a precise quantity of fluid solder and the design of the gun inhibits simultaneous multiple soldering points or holes. Since dispensing is controlled by pressure displacement and not by contact with the component to be soldered, excess solder usually results and must be squeegeed off (see U.S. Pat. No. 5,191,709). The prior art had earlier used plate valves with internal tubes to hold a given solder volume quite remote from the parts to be soldered (see U.S. Pat. NO. 3,025,817). The solder quantity is dropped onto a metal capacitor snugly held in a ceramic sleeve to contain and support the solder; the plate valve must be manually actuated with no contact with the component to be soldered and depends upon the component itself to contain the solder. These devices fail to provide dispensing of a measured quantity of fluid solder by contact with the parts to be soldered, and fail to contain the solder in cooperation with the parts, after the solder is dispensed, thereby to function with the pin-in-through-hole soldering zone.

SUMMARY OF THE INVENTION

It is an object of this invention to provide a solder dispensing apparatus for deposition of fluid solder into and around a pin-in-through-hole joining zone of an electronic circuit board that achieves one or more of the following: deposits the fluid solder by injection of a predetermined, measured quantity, limits the thickness and diameter of the dispensed solder by containment after deposition; is reliably and simply actuated mechanically by contact with the parts to be soldered, eliminates the necessity for heating and avoids a heat sink problem by holding the heated solder reservoir always in continuos contact with the valve, seals the valve to the parts to be soldered during the injection process to avoid solder bridges between adjacent joints, and facilitates the simultaneous multiple injection of solder into a plurality of closely adjacent joints.

The invention herein which meets one or more of the above object aspects comprises: (a) a valve defining a valve chamber with an inlet and an outlet and having a valve member actuated by the pin of a pin-in-through-hole joining zone when said valve is positioned at said zone against the board, the valve member moving from a first position closing off fluid flow from the outlet to a second position permitting fluid flow from the chamber outlet; (b) means for measuring a predetermined body of fluid solder that is released from the chamber when the valve member is in the second position; and (c) means to contain the released fluid solder in a predetermined shape in and around the pin-in-through-hole joining zone while the solder solidifies.

BRIEF DESCRIPTION OF THE DRAWINGS

FIG. 3 is a view similar to FIGS. 1 and 2 illustrating the valve in a withdrawn position after the fluid solder has been dispensed and the solder joint solidified;

FIG. 4 is a schematic sectional view of an alternative valve assembly also embodying the invention;

FIG. 5 is a view similar to that of FIG. 4 illustrating yet still another alternative embodiment.

DETAILED DESCRIPTION AND BEST MODE

Figure 1:
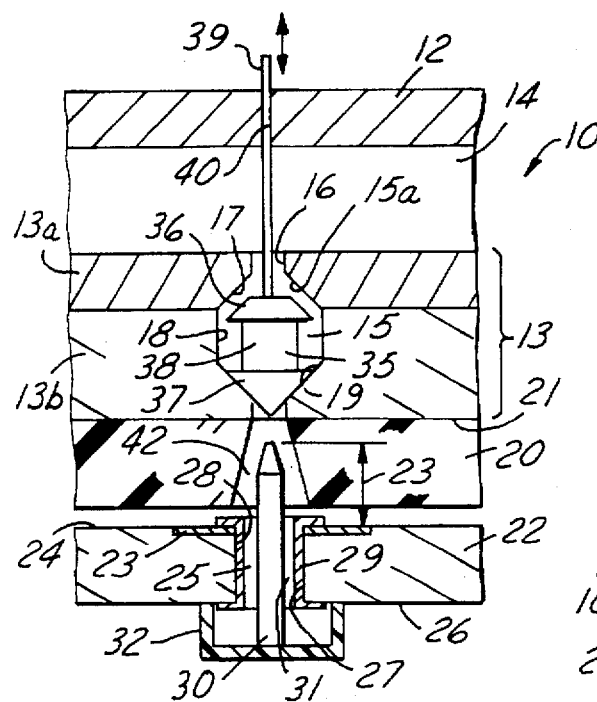
FIG. 1 is a schematic sectional view of a valve assembly embodying this invention; the assembly is illustrated in a first position to dispense fluid solder onto an electronic board.

As shown in FIG. 1, the solder dispensing assembly 10 is constructed with a reservoir 11 that retains heated molten solder 14. The space in the reservoir above the solder is filled with a protective blanket (such as an inert gas, solder pot oil) to prevent oxidation of the molten solder with attendant dross formation. The reservoir has a top wall 12 spaced from a bottom wall 13 between which is disposed the body of fluid solder 14. Wall 13 functions as a valve housing defining a valve chamber 15; wall 13 is comprised of two titanium plates 13a and 13b, of sufficient thickness, such as 4–12 mm., to facilitate machining of undercut walls forming the chamber 15. The chamber has an upper portion 15a comprised of a channel 16 and a space delimited by conical surface 17, acting as a valve inlet closure seat; a lower portion 15b is comprised of a cylindrical wall 18 and a conical surface 19 inverted relative to conical surface 17. The surface 19 serves as a valve outlet closure seat. The chamber has its largest cross-sectional area larger than one or both the inlet and outlet of the chamber.

A mask or membrane 20, comprised of high temperature resistant elastomeric compound, such as rubber, is secured to the flat surface 21 of wall 13 to function as a resilient sealing member when the dispensing assembly is brought into dispensing contact with an electronic circuit board 22. The board has printed circuit material 23 on at least one side 24. One or more through holes 25 are provided in the board, extending between side 24 and opposite side 26. The through hole wall 27 and margin 28 are preferably covered with a thin conductive material 29, such as copper, to function as a terminal to which an electrical and heat conductive joint is formed with an electrical lead pin 30 extending therethrough in spaced relation from the material 29 resulting in a cylindrical gap 31 therebetween. The thickness of the board will typically range from 0.04 to 0.12 inches (1–3 mm.). The pin diameter will range from 0.02 to 0.04 inches (0.5–2 mm.) and the gap between the pin and hole diameter will range from 0.025 to 0.100 inches (0.4–2.5 mm.). The pin is supported by a nonconductive holder 32 that abuts side 26 of the board to allow the pins to extend not only through the holes 25 but beyond a distance 33 above the board surface 24 of about 0.020–0.080 inches (1.5–2.0 mm.). This distance is needed to allow the pin to act as a trigger for valve actuation.

A valve element 35, also of titanium metal, is disposed in the chamber 15 to move up and down therein to control fluid solder passing through the chamber. The element 35 has a conical head 36 at one end shaped to matingly fit against inlet surface 17 and a conical head 37 at the other end shaped to matingly fit against outlet seat 19. The heads are connected by cylindrical body 38 having a diameter slightly smaller than the heads 36 and 37, thereby providing sufficient mass and weight for the element to move downwardly and close the valve chamber under the influence of gravity. A stem 39 extends from the valve element up through the channel 16, through the reservoir space holding the solder 14, and through a snug opening 40 in the top wall 12. The stem functions to center and align the up and down movement of the valve element. The valve elements 35 can be actuated by having the stems 39 all mechanically jointed at 90 and moved in unison when a standard 91 is contacted by the board(see FIG. 1A); this avoids damaging small or delicate pins.

Figure 2:
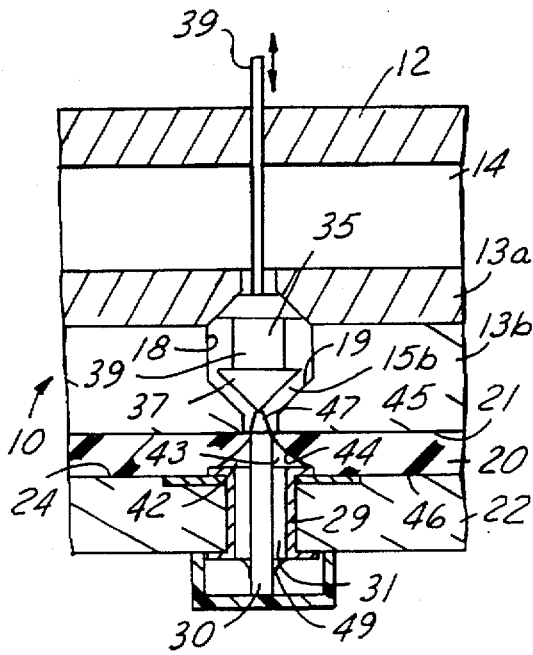
FIG. 2 is a view similar to that of FIG. 1 illustrating the valve in a second position of operation.

The assembly possesses a fluid solder measuring means 41 that defines a volume comprised of the volume defined in chamber 15 less the volume of the valve element 35 therein. Thus, an accurate and predetermined amount of solder is released for each joint to be formed. The solder volume, present in the chamber 15 after having been filled with the valve element closed against the outlet seat 19 (see FIG. 1), is automatically measured as a result of closing off the inlet when valve element engages seat 17 (see FIG. 2). The measured volume of solder is allowed to release from the chamber and flow into a containment zone 42. Movement of the valve element to achieve release is obtained automatically and mechanically when the membrane 20 of the dispensing apparatus is placed flush against the circuit board side 24. The end 47 of pin 30 will engage the valve head 37 and raise the element 35 upwardly to obtain chamber inlet closure. Actual inlet closure may be obtained after the membrane touches the board, because, the resiliency of the membrane will allow further lowering of the dispensing apparatus to thereby allow the further upward penetration of the pin to move the valve element to achieve complete inlet closure.

After release of the fluid solder with the apparatus so engaged against the circuit board, a containment means 43 shapes the fluid solder in a joint forming condition. The containment means 43 is comprised first of parabolically shaped containment walls 44 defined as a diverging channel in the membrane 20 extending from side 45 of the membrane to its opposite side 46. Secondly, the containment means 43 comprises the metallic material 29 on the circuit board in through-hole 25; the metallic coating functions to complete the containment shape.

Upon dispensing, the solder will flow downwardly into gap 31 and form a bottom meniscus 49 (preferably depending from the bottom edge 48 of the hole 25). Surface tension of the solder with the pin and metallic material coating the hole, will promote the formation of the meniscus 49. The fluid solder will solidify, in a matter of seconds after dispensing, due to the heat sink provided by the circuit board which lowers the temperature of the solder.

After solidification, the dispensing apparatus is raised and withdrawn from the circuit board as shown from FIG. 3. The valve element will drop as a result of raising from the pin 30 and will remain in the dropped position, closing off the outlet seat 19. The resulting solder joint 50 has precisely formed upper and lower contours and fully fills the gap 31 without discontinuities, dissolved gasses or solvents. There is no premature heat sink that will disrupt the formation of the soldered joint, the accuracy of the soldered diameter and evenness of fill is assured. The joint formation is mechanically initiated and completed with no fear of bridging to adjacent or close joints.

Upon dispensing, the solder will flow downwardly into gap 31 and form a bottom meniscus 49, preferably depending from the bottom edge 48 of the hole; surface tension of the solder to the pin and metallic hole margins will promote the formation of the bottom meniscus 49. The dispensed solder will solidify within a matter of seconds due the heat sink provided by the circuit board which lowers the temperature of the solder. The resulting solder joint 50 will have precisely formed upper and lower contours and fully fills the gap with no dissolved gasses or solvents.

The alternative embodiment shown in FIG. 4 illustrates how the measuring means 41 and containment means 43, previously defined in the reservoir walls and membrane, can now be defined primarily within the moveable valve element while still allowing the valve assembly to be actuated mechanically and placed flush on the printed circuit board over a pin-in-through-hole. The reservoir 51 has a top wall 52 and a bottom wall 53 comprised of titanium metal to contain the heated fluid solder 14. A flexible distendable membrane 54 (comprised of high temperature resistant elastomer which is stable when in contact with molten solder) is disposed on the inside of the bottom wall 53 and has an opening defined by a conical wall 55 aligned with a larger opening 56 in reservoir wall 53, as shown in FIG. 4. The surface 55 acts as a valve guide against which a valve member 57 sealingly slides when moved up and down; the conical wall 55 resiliently distends to allow an increasing diameter of the conical outer surface 58 of the valve element to penetrate upwardly therethrough, as shown in dotted outline in FIG. 4.

The valve member has a hollow interior 59 defined by conical wall 60 shaped to contain the upper meniscus of the solder when deposited. The hollow interior 59 has two or more channels 61 communicating with the conical outer surface 58 at or near the upper region of the valve element. A stem 63, secured to the top of the valve element, has an integral flange 66 at its other end which is normally biased by coiled compression spring 64 (contained between the flange 66 and a fixed spring housing 65) to lower the valve element to a position as shown in full line in FIG. 4. When channels 61 are blocked from communicating with the molten solder 14 (full line position in FIG. 4), the valve is closed. When the assembly 10 is placed with its bottom wall 53 flush against the circuit board 22, the end 47 of the pin 30 engages apex 67 of the conical wall 60 thereby forcing the valve element to move upwardly against the force of spring 64, distending the membrane wall 55, and bringing the entrances of the channels 61 into fluid communication with the body of molten solder 14 (dotted outline in FIG. 4). Molten solder will flow into the conical interior of the valve and thence into gap 31 defining a bottom meniscus 49, resulting from surface tension, and a top meniscus 48 shaped and contained by conical wall 60 (containment means 43). The conical wall 60 may have a parabolic shape as shown in FIG. 4. At the same time a precise amount of molten solder is measured for dispensing into gap 31 as a result of the cooperation and mating of conical wall 60 and parts of the circuit board to define a measured space, such as between the metallic coating on side wall 27 and its margins 28 (measuring means 41). The advantage of this alternative assembly is that it has the ability to influence the shape of the resultant solder fillet, and is activated by the board surfaced not the pin, thereby avoiding damage of the pin by contact with the tool.

The other alternative embodiment, as shown in FIG. 5, again uses the same walls for both the measuring means 41 and the containment means 43; while using a simple open and close type of valve operation. Here, the reservoir 79 has a top wall 80 and a titanium bottom plate wall 81 between which is contained a heated supply of the molten solder 14. The wall 81 has a large conical valve seat surface 69 allowing the molten solder to pass through to a small cylindrical opening 70 penetrating the bottom surface 71 of the wall 81, when such opening is uncovered. A resilient mask membrane 72 is secured to the surface 71 of plate wall 81 and has an inverted conical or parabolic wall 73 aligned with the opening 70. The thickness 74 of the membrane is predetermined to be shorter than the length or distance 33 that pin 30 extending above the circuit board 22, so that when the assembly 10 is placed flush with bottom surface 75 of the membrane, against the top 82 of the circuit board, the tip 76 of the pin 30 contacts the bottom 77 of moveable valve element 78 (sitting tightly on seat wall 69 as shown in full line in FIG. 5) and raises the valve element 78 to an open position as shown in dotted outline in FIG. 4. Valve element 78 is normally biased to the closed position as shown in FIG. 5 by a spring acting on stem 79, which bias is overcome upon engagement with pin 30.

Figure 1A:
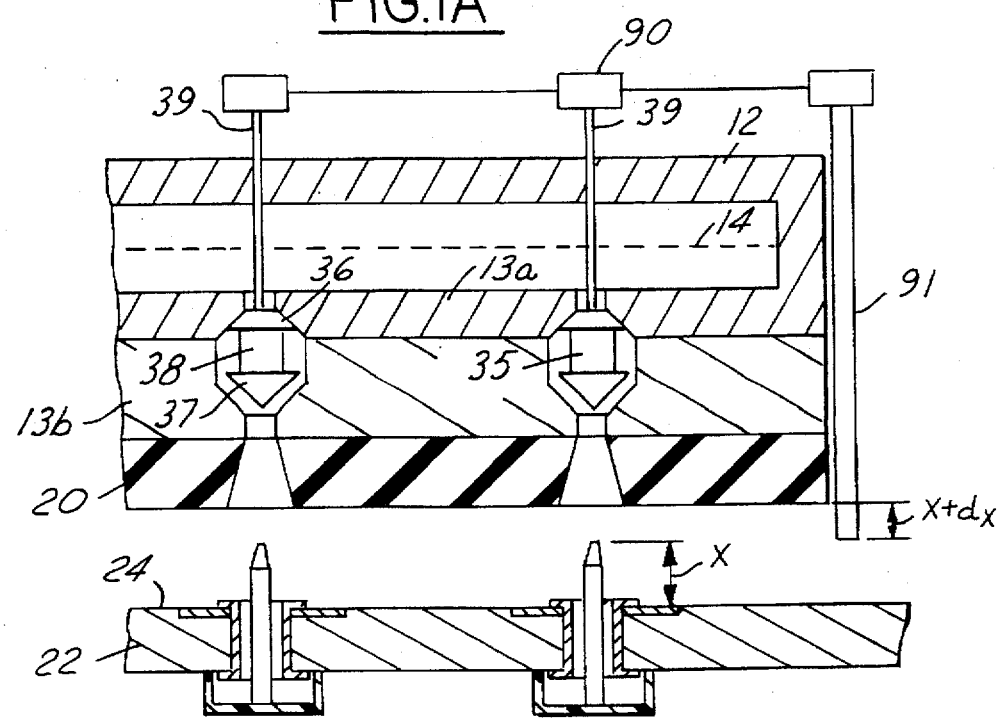
FIG. 1A is a view similar to FIG. 1, showing an alternative means for commonly actuating all of the stems concurrently.

The conical or parabolic wall 73 cooperates with the circuit board, when the assembly is flush thereagainst, to define a containment space 85 to act as the containment means 43 and at the same time precisely measure the volume of molten solder released to the joint zone 50 to act as the measuring means 41. The advantage of this alternative assembly is that it can be activated by the connector pin or by tying all stems 79 to a plate which can be actuated other than by the pin as shown in FIG. 1A.

Figure 6:
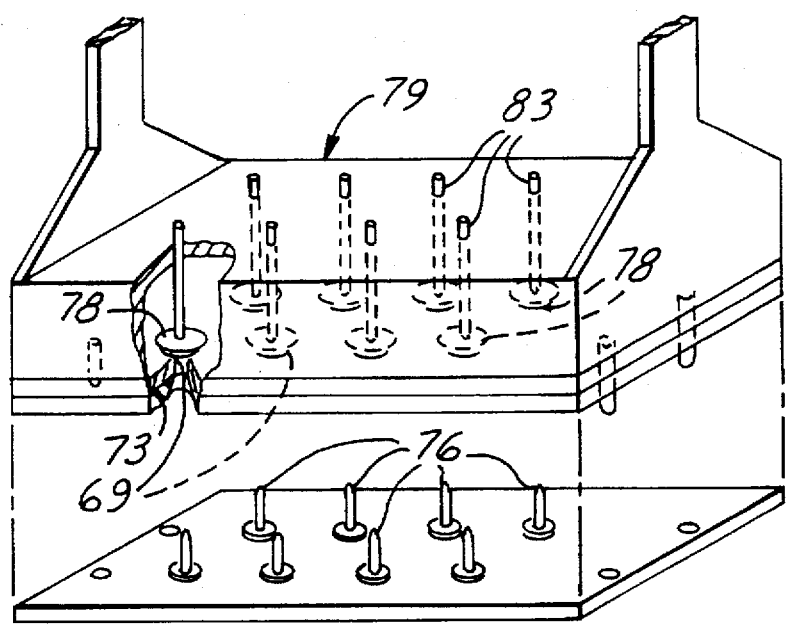
FIG. 6 is a perspective view of the dispensing apparatus of this invention showing its use with multiple dispensing units for a plurality of pin-in-through-hole soldering zones that are closely spaced.

FIG. 6 illustrates how the containment means prevents bridging to adjacent pin-in-through-hole soldering zones.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. A solder dispensing apparatus for depositing fluid solder into and around a pin-in-through-hole joining zone of an electronic circuit board, comprising:

(a) a valve assembly defining a valve chamber with an inlet and an outlet, and having the valve member actuated by the pin of said pin-in-through-hole joining zone when said valve is positioned at said zone against said board, said valve member moving from a first position closing off fluid flow from said outlet to a second position permitting fluid flow through the outlet;

(b) means for measuring a predetermined body of fluid solder that is released from said chamber when said valve member is in said second position with the assembly positioned at said zone against said board; and (c) means to contain the released fluid solder in a predetermined shape and in and around said pin-in-through-hole joining zone while said solder solidifies.

2. The dispensing apparatus as in claim 1, in which said valve assembly has rigid walls defining an enclosed valve chamber that has its largest cross-sectional area larger than both the inlet and outlet of said chamber.

3. The dispensing apparatus as in claim 1, in which said valve assembly has rigid walls defining an enclosed valve chamber that has its large cross-sectional area larger than one of either the inlet or outlet.

4. The dispensing apparatus as in claim 1, in which said valve assembly defining the valve chamber is comprised of one or more titanium plates.

5. The dispensing apparatus as in claim 2, in which said valve assembly defines said valve chamber by use of two mating titanium plates defining a chamber divided at a mating plane which resides between the inlet and outlet.

6. The dispensing apparatus as in claim 1 in which said valve assembly additionally has a flexible membrane defining walls of the valve chamber.

7. The dispensing apparatus as in claim 1, in which the valve member has one or more closure surfaces for engaging or disengaging said outlet when moved respectively to the first or second position.

8. The dispensing apparatus as in claim 1, in which the inlet or outlet is defined by a conical wall surface and said valve element has a mating conical wall surface for seating thereagainst.

9. The dispensing apparatus as in claim 1, in which said valve element is biased normally to the first position closing off fluid flow from the outlet which bias is overcome by contact with the pin of the circuit board.

10. The dispensing apparatus as in claim 1, in which the valve member is carried by a stem, the stem being automatically or manually controlled to effect the first position.

11. The dispensing apparatus as in claim 1, in which said means to contain comprises a channel defined in said valve assembly juxtaposed the outlet of the valve, said pin penetrating through said channel to engage and affect movement of the valve member to the second position.

12. The dispensing apparatus as in claim 1, in which said means for measuring is comprised of a resilient mass membrane having a channel defining a measured volume, said resilient mass membrane being comprised of high temperature resistant rubber.

13. The dispensing apparatus as in claim 1, in which said means to measure comprises sizing said valve chamber to contain a predetermined measured quantity of fluid solder in actuating the valve member between said first position where fluid is allowed to fill the chamber and the second position where the inlet is closed, and the measured quantity permitted to flow from the outlet.

14. The dispensing apparatus as in claim 1, in which said means to measure comprises a predetermined sized hollow interior of said valve element with channels communicating the hollow interior with the valve exterior, said channels being placed so that when in the first position, said channels are blocked from communicating with the solder supply while the outlet is closed, and in the second position the predetermined quantity of solder is released to the joint zone.

15. The dispensing apparatus as in claim 1, in which said means for measuring is comprised of walls defining a hollow interior in said valve element, which walls cooperate with the circuit board when the dispensing apparatus is placed flush thereagainst to define a measured volume.

16. The dispensing apparatus as in claim 1, in which said means for measuring is comprised of walls in said valve assembly, separate from said valve element, extending from the valve outward, which walls cooperate with the circuit board when the dispensing apparatus is placed flush thereagainst to define a measured volume.

17. The dispensing apparatus as in claim 1, in which said containment means is defined by walls in said valve assembly, separate from said valve element, which extend from the valve outlet, which walls cooperate with the circuit board when the dispensing apparatus is placed flush thereagainst to define a containment for the dispensed fluid solder.

18. The dispensing apparatus as in claim 1, in which said containment means is defined by walls defining a hollow interior in said valve element, which walls cooperate with the circuit board when the dispensing apparatus is placed flush thereagainst to define a containment for the dispensed fluid solder.

* * * * *